United States Patent [19]
Leverant et al.

[11] Patent Number: 6,143,141
[45] Date of Patent: *Nov. 7, 2000

[54] METHOD OF FORMING A DIFFUSION BARRIER FOR OVERLAY COATINGS

[75] Inventors: Gerald R. Leverant; James Arps; John Campbell; Richard Page, all of San Antonio, Tex.

[73] Assignee: Southwest Research Institute, San Antonio, Tex.

[*] Notice: This patent is subject to a terminal disclaimer.

[21] Appl. No.: 08/928,992

[22] Filed: Sep. 12, 1997

[51] Int. Cl.$^7$ .................................................. C23C 14/34
[52] U.S. Cl. .............................. 204/192.15; 204/192.12; 204/192.22; 427/226; 427/372.2; 427/379; 427/380; 427/383.1
[58] Field of Search ........................ 204/192.15, 192.12, 204/192.22; 427/226, 372.2, 379, 380, 383.1

[56] References Cited

U.S. PATENT DOCUMENTS

| | | | |
|---|---|---|---|
| 3,620,693 | 11/1971 | Seaford et al. | 428/553 |
| 3,904,402 | 9/1975 | Smashey | 420/436 |
| 4,109,061 | 8/1978 | Beale et al. | 428/678 |
| 4,305,998 | 12/1981 | Manty et al. | 428/661 |
| 4,465,524 | 8/1984 | Dearnaley et al. | 148/316 |
| 4,743,308 | 5/1988 | Sioshansi et al. | 148/239 |
| 4,915,746 | 4/1990 | Welsch | 428/661 |
| 5,316,866 | 5/1994 | Goldman et al. | 428/621 |
| 5,538,796 | 7/1996 | Schaffer et al. | 428/469 |
| 5,556,713 | 9/1996 | Leverant | 428/610 |
| 5,817,371 | 10/1998 | Gupta et al. | 427/454 |

FOREIGN PATENT DOCUMENTS

| | | |
|---|---|---|
| 0 412 397 A1 | 2/1991 | European Pat. Off. . |
| 52-72336 | 6/1977 | Japan . |
| 3203135 | 4/1991 | Japan . |
| 660 200 A5 | 3/1987 | Switzerland . |
| WO 81/02694 | 10/1981 | WIPO . |

OTHER PUBLICATIONS

A. F. Giamei, et al., "Rhenium Additions to a Ni–Base Superalloy: Effects on Microstructure." Metallurgical Transactions A, v. 16A, p. 1997–2005 (Nov. 1985).

N. Czech, et al., "Improvement of MCrAlY coatings by addition of rhenium." Elsevier Science S.A. p. 17–21 (1994).

H. Murakami, et al., "The location of atoms in Re–and V–containing multicomponents nickel–base single–crystal superalloys." Applied Surface Science, p. 177–183 (1994).

D. Blavette, et al., "An Atom Probe Investigation of the Role of Rhenium Additions in Improving Creep Resistance of Ni–Base Superalloys." Pergamon Journals, v.20, p. 1395–1400 (1986).

"Surface Cleaning, Finishing, and Coating." Metals Handbook, 9$^{th}$ ed., v.5 p. 417–426 (Oct. 1982).

K. Legg, "Surface Engineering with Ion–Assisted Coatings." Nuclear Instruments and Methods in Physics Research 824/25, p. 565–67 (1987).

G. Dearnaley, "Materials Science Aspects of Ion Beam Technology." Surface Engineering, v. 7:7, p. 127–136 (1991).

L. Piechl, et al., "Overlay and Diffusion Coatings for Aero Gas Turbines." Materials for Advanced Power Engineering 1994, p. 717–740, (Oct. 1994).

Primary Examiner—Kery Fries
Assistant Examiner—Dawn Garrett
Attorney, Agent, or Firm—Paula D. Morris & Associates P.C.

[57] ABSTRACT

Superalloy substrates bearing a rhenium diffusion barrier, and a method of forming a rhenium diffusion barrier between a superalloy substrate and an overlay coating comprising aluminum. The method involves depositing a rhenium film onto the surface of a superalloy substrate and subjecting the rhenium film to first conditions effective to cause a minor portion of rhenium atoms to penetrate the surface of the superalloy substrate and second conditions effective to cause a minority of the rhenium atoms to diffuse into the substrate, forming a diffusion barrier comprising an interfacial zone comprising a mixture of rhenium atoms and atoms of the superalloy substrate covered by a rhenium film. The diffusion barrier is effective to suppress diffusion of aluminum from the overlay coating under static oxidation testing conditions.

27 Claims, 1 Drawing Sheet

METHOD OF FORMING A DIFFUSION BARRIER FOR OVERLAY COATINGS

FIELD OF THE INVENTION

The present invention relates to a method for forming a barrier to prevent the diffusion of aluminum from overlay coatings for components used in high stress, high temperature applications. More particularly, the present invention relates to a sputter deposition/thermal diffusion method for forming a rhenium diffusion barrier to prevent the diffusion of aluminum from MCrAlY overlay coatings into a superalloy substrate.

BACKGROUND OF THE INVENTION

Components used in high stress, high temperature applications ("high intensity" components) typically are provided with overlay coatings to prevent material oxidation and hot corrosion during service. One type of overlay coating for high intensity components, such as gas turbines, is an overlay coating. An "overlay" coating is conceived and optimized separately from the substrate so that the overlay coating can form an adherent and stable protective oxide (most often $Al_2O_3$) at the coating-atmosphere interface. Thermal barrier coatings are a type of overlay coating. A popular overlay coating has a chemical composition of "MCrAlY"—where "M" is nickel, cobalt, or both, Cr is chromium, Al is aluminum, and Y is yttrium.

Certain types of components are subject to particularly high stress and high temperature conditions during use hereinafter called "super high intensity" components). Examples of super high intensity components are jet engine parts and turbo-superchargers. In order to withstand the extreme service conditions, super high intensity components typically are made of a base material known as a "superalloy." Superalloys exhibit high temperature mechanical integrity with an unusual degree of oxidation and creep resistance.

Unfortunately, overlay coatings for high intensity and super high intensity components are not, themselves, immune to material degradation. One cause of material degradation in MCrAlY overlay coatings is the diffusion of constituents from the coating, particularly the diffusion of aluminum.

Some have attempted to improve the performance of MCrAlY coatings by adding high atomic weight elements, such as rhenium (Re), as an integral component of such coatings. Overlay coatings comprised of MCrAlY laced with rhenium are reported to have increased oxidation resistance and decreased thermal and material degradation.

Although some success has been reported when Re is used as an integral additive in MCrAlY overlay coatings, the use of Re as an integral additive to the coating necessarily results in random distribution of Re atoms throughout the overlay coating. Some of the constituent aluminum atoms in the coating necessarily will diffuse past such randomly dispersed Re atoms and out of the overlay coating.

Some have attempted to form rhenium diffusion barriers by simply applying a coating of rhenium to the surface of a superalloy substrate. A simple rhenium coating is not effective to prevent diffusion between a superalloy substrate and an overlay coating while maintaining structural integrity under the rigorous conditions that would be encountered by "high intensity" superalloy components. Simple rhenium coatings are brittle, continuous, and unstable, and have very often been attempted and found not to work.

The use of electron beam physical vapor deposition to deposit rhenium onto the superalloy substrate, coupled with the use of an ion beam as a source of energy to cause rhenium atoms to actually penetrate and diffuse into the substrate, also has been suggested. The result is said to be a coating of rhenium atoms at the surface of the superalloy substrate and an adjacent interfacial layer comprising a mixture of superalloy atoms and rhenium atoms which adhere the coating to the substrate and are uniquely positioned in the substrate to slow diffusion between the substrate and the overlay coating.

For components with complex geometries, it can be difficult to achieve a uniform diffusion barrier using ion beam assisted deposition. Alternative methods are needed for depositing diffusion barriers which are capable of achieving more uniformity.

SUMMARY OF THE INVENTION

The present invention provides a method of forming a diffusion barrier between a superalloy substrate and an overlay coating comprising aluminum. The method comprises, in an inert atmosphere: forming a first film comprising a quantity of rhenium atoms at a surface of the superalloy substrate; subjecting the first film to first conditions effective to retain a majority of the quantity of rhenium atoms on the surface while causing a minor portion of the quantity of rhenium atoms to penetrate into the surface; and, subjecting the overlay coating to second conditions effective to form a diffusion barrier comprising an interfacial zone coated by a second film, the interfacial zone comprising a minority of the quantity of rhenium atoms mixed with atoms of the superalloy substrate, a major portion of the rhenium atoms comprising the second film, wherein the diffusion barrier is effective to suppress diffusion of aluminum from the overlay coating under static oxidation testing conditions.

DETAILED DESCRIPTION OF THE INVENTION

Figure 1:
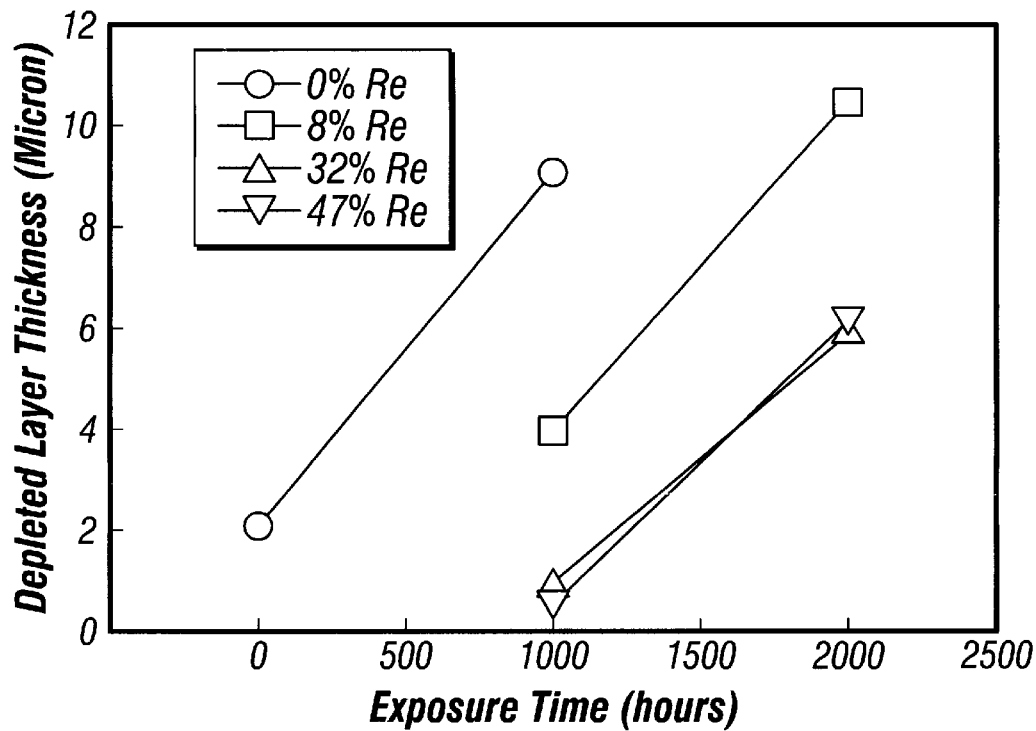
FIG. 1 is a chart showing the depletion zone thickness vs. exposure time for the oxidation coupons of Example II.

Substantially any high intensity superalloy component may be treated to form the diffusion barrier of the present invention. Preferred components are comprised of nickel- or cobalt-base superalloys. As used herein, the term "overlay coating" is defined to refer to any overlay coating or thermal barrier coating that is used to protect high intensity components. Overlay coatings suitable for treatment according to the present invention may be made using any acceptable method.

In a preferred embodiment, at least one layer of the overlay coating is MCrAlY. A preferred embodiment of the invention involves forming one or more rhenium diffusion barriers: (1) between the outer surface of the superalloy component and the inner surface of the overlay coating; (2) at the outer surface of the overlay coating; or, (3) both.

Rhenium is a preferred material for use in forming the diffusion barrier of the present invention. A film of rhenium atoms should be deposited onto the substrate in an inert environment. This initial film of rhenium atoms is referred to in the claims as a "first" film. The "first" film of rhenium of rhenium atoms may be formed in a number of ways, a primary limitation being that the method must impart enough energy to the relatively large rhenium atoms in the source material to dislodge the rhenium atoms from the source material, which typically will be a solid, and to transport the rhenium atoms from the source to the surface of the superalloy substrate. However, the conditions should not be so intense as to prevent the formation of the first film of rhenium atoms on the surface of the superalloy substrate. Examples of suitable methods of forming the "first film" of rhenium atoms include simply spraying or "painting" melted rhenium or rhenium alloy onto the surface, and physical or chemical vapor deposition of the rhenium or rhenium alloy atoms onto the surface. In a preferred process, rhenium atoms are sputter deposited onto the surface of the substrate, as described more fully below.

After deposition, the rhenium film is subjected to a source of energy, preferably in an inert environment. The energy should be sufficiently intense to cause a minority of the relatively large rhenium atoms, preferably less than about 10% of the total number of rhenium atoms in the first film, to penetrate through the surface of the substrate and to diffuse into the substrate to form an interfacial zone. However, the energy should be sufficiently mild to allow the remainder of the rhenium atoms in the first film, preferably at least about 90% of the total number of rhenium atoms, to remain on the surface of the substrate, forming what is referred to in the claims as a "second film" of rhenium atoms. The energy also preferably should be capable of uniform application, even when the substrate has a complex geometrical structure. A variety of energy sources may be used, such as indirect heating in a resistance furnace, direct heating with a high frequency electromagnetic source, and ion bean mixing. It may even be possible to adapt a light source to supply such energy, although it may be difficult to achieve uniformity with a high energy light source, such as a laser beam. A preferred source of energy is indirect heating in a resistance furnace.

In a preferred embodiment, the energy is supplied in two separate steps. In a first step, the substrate coated with the rhenium film is exposed to an amount of energy sufficient to cause a minority of the rhenium atoms to penetrate the surface of the substrate. In a preferred embodiment, this step comprises heating the coated superalloy substrate to a temperature in the range of from about 1000° C. (1832° F.) to about 1150° C. (2100° F.), preferably about 1080° C. (1975° F.), for a relatively short period of time, preferably about one hour. Thereafter, an overlay coating preferably is formed and then annealed in an inert atmosphere. The heat of annealing provides the energy for the second step. After application of the overlay coating, the coating is heated to a temperature in the range of from about 1010° C. (1850° F.) to about 1150° C. (2100° F.), preferably about 1080° C. (1975° F.), for a time in the range of from about 1 hour to about 8 hours, preferably for about four hours. The annealing step is believed to provide sufficient energy to cause the rhenium atoms, which already have penetrated into the surface of the substrate, to diffuse farther into the substrate. Additional rhenium atoms also may penetrate the surface of the substrate and even diffuse to some depth during the annealing process.

Regardless of the type of energy used, the result of exposing of the rhenium film to a sufficient type and level of energy is to cause a minority of the rhenium atoms to penetrate through the surface of the substrate, and to diffuse into the adjacent substrate to form an interfacial zone comprising a mixture of atoms of rhenium and atoms of the substrate. A film comprising the bulk of the rhenium atoms remains at the surface of the substrate. The interfacial zone and the remaining rhenium film are the diffusion barrier of the present invention.

An amount of diffusion similar to that caused by the method using the two heating steps described herein clearly is sufficient to form an effective diffusion barrier. Any method which causes a similar amount of diffusion, or an amount of diffusion effective to suppress the diffusion of aluminum from an overlay coating into the substrate under static oxidation conditions, is encompassed by the spirit and scope of the present invention. Persons of ordinary skill in the art would expect a diffusion barrier that operates successfully under "static oxidation conditions" (as described in the examples and understood by persons of ordinary skill in the art) also to operate successfully during actual use under high intensity conditions.

In a preferred method for making the diffusion barrier of the present invention, a superalloy component is cleaned using conventional procedures to remove superficial contaminants, such as grease. The component is placed in a vacuum chamber and the pressure is evacuated, preferably to less than about $10^{-5}$ torr. The component is bombarded with ions, preferably argon ions, at an energy in the range of from about 1 keV to about 10 keV, preferably at an energy of about 2 keV, to remove adsorbed atoms from the surface.

A preferred source of rhenium for the diffusion barrier is a rhenium alloy comprising at least about 30% rhenium. A preferred rhenium alloy is a nickel-rhenium alloy. The rhenium or rhenium alloy source preferably is sputtered with ions until a sufficient number of rhenium or rhenium alloy atoms are disengaged from the source and sputter deposited onto the substrate to form a film of rhenium or rhenium alloy at the surface of the substrate. The film preferably is deposited to a thickness in the range of from about 0.1 $\mu$m to about 50 $\mu$m, most preferably to a thickness of about 0.5 $\mu$m, in order to avoid residual stresses in the coating and spallation problems. The thickness of the film may be monitored by standard methods, e.g., using the frequency change of a quartz crystal oscillator. Rhenium metal is available from a number of commercial sources, examples being Aldrich Chemical Co., Milwaukee, Wis., and Climax Molybdenumn, 1370 Washington Pike, Bridgeville, Pa.

Substantially any gaseous ions may be used in the sputter deposition process. Heavier ions, such as krypton and xenon ions, produce a better overall sputter yield and—if the target is a rhenium alloy—a distribution of atoms that more closely resembles the composition of the alloy. Preferred ions for the sputtering process are krypton ions. The energy of bombardment should be sufficient to propel atoms of the rhenium or rhenium alloy from the source to the surface of the component. A preferred energy of bombardment is in the range of from about 0.25 keV to about 10 keV. A preferred current density for the sputtering is in the range of from about 1 mA/cm$^2$ to about 10 mA/cm$^2$.

After a film of rhenium or rhenium alloy is deposited onto the outer surface of the component, the component preferably is retained in the same vacuum chamber or may be moved to a second vacuum chamber. Preferably in the same vacuum chamber, the component is heated to a temperature in the range of from about 1000° C. (1832° F.) to about 1150° C. (2100° F.), preferably at about 1080° C. (1975° F.), for at least about one hour to cause at least some of the rhenium atoms to penetrate into the superalloy substrate. Where the rhenium is deposited on the superalloy component, itself, the heating step should be followed by the formation of an overlay coating. In a preferred embodiment, an MCrAlY coating is deposited using any known method, preferably electron beam physical vapor deposition (EB-PVD) or low pressure plasma spray (LPPS). The MCrAlY coating then should be annealed, preferably by heating to a temperature in the range of from about 1010° C. (1850° F.) to about 1150° C. (2100° F.), preferably at about 1080° C. (1975° F.), for a time in the range of from about 1 hour to about 8 hours, preferably for about four hours, in an inert atmosphere. Thereafter, the process may be repeated, if desired, to form a rhenium diffusion barrier at the outer surface of the MCrAlY coating.

The invention will be more clearly understood with reference to the following examples.

Test Substrate

In the following examples, the superalloy substrate was an IN738LC turbine blade. IN738LC turbine blades are well known in the art, may be obtained from a number of commercial sources, and have the following nominal composition:

| Element | Composition, wt. % |
|---------|--------------------|
| Ni | 61 |
| Cr | 16.0 |
| Co | 8.5 |
| Mo | 1.7 |
| W | 2.6 |
| Ta | 1.7 |
| Nb | 0.9 |
| Al | 3.4 |
| Ti | 3.4 |

Rectangular oxidation coupons (2.54 cm×1.27 cm×1.5 mm thick) were machined from an IN738SLC blade using a wire electro-discharge-machining (EDM) process. The surfaces of the coupons were grit blasted following machining. Metallographic evaluation indicated that the grit blasting was effective in removing all of the melt layer produced by the EDM process.

EXAMPLE I

Three nickel/rhenium alloys were obtained having the following compositions: Ni-8% Re; Ni-32% Re; and Ni-47% Re. The alloys were used as targets to sputter deposit 0.5 μm thick nickel/rhenium diffusion barriers onto rectangular oxidation coupons, 4 coupons for each alloy using a krypton beam at 6 KeV. The results showed that the rhenium content of the coating matched the rhenium content of the target. Half of the coupons—two of each coating composition—were subjected to a one hour vacuum thermal anneal at $10^{-7}$ torr and 1080° C. (1975° F.), resulting in oxidation coupons that had been subjected to the following series of conditions:

| Sputter Deposited Coating | Thermal Anneal |
|---------------------------|----------------|
| Ni-8 wt. % Re, 0.5 μm thick | None |
| Ni-8 wt. % Re, 0.5 μm thick | 1080° C. (1975° F.) for 1 hour |
| Ni-32 wt. % Re, 0.5 μm thick | None |
| Ni-32 wt. % Re, 0.5 μm thick | 1080° C. (1975° F.) for 1 hour |
| Ni-47 wt. % Re, 0.5 μm thick | None |
| Ni-47 wt. % Re, 0.5 μm thick | 1080° C. (1975° F.) for 1 hour |
| None | None |

EXAMPLE II

The oxidation coupons prepared in Example I were divided into two identical groups. One group was given an outward diffusing simple aluminide coating. The other group was given a NiCoCrAlY coating using an electron-beam physical vapor deposition process, Following the application of these coatings, static oxidation tests were conducted, consisting of 1000 hours of exposure at 926° C. (1700° F.). During the exposure, the coupons were supported on alumina platens with the test surface facing upward. The temperature was monitored by a thermocouple placed directly above the specimens and recorded continuously. The time and temperature for these exposures were selected based on evaluation of literature data on diffusion of Re in Ni and degradation rates of MCrAlY coatings. Following sectioning for metallographic evaluation, the NiCoCrAlY coated samples were given an additional 1000 hour exposure at 926° C. (1700° F.).

Following these exposures, each coupon was sectioned along its centerline, mounted in a conductive mounting media, and metallographically polished. The microstructures exhibited in the coatings and diffusion zones were examined in a scanning electron microscope. The samples were examined in the unetched condition using backscattered electrons to provide contrast due to compositional differences. A Cameca microprobe at Howmet Corporation was used to determine the composition of the various phases present and to measure composition profiles from the coating, across the diffusion zone and into the base metal. The measurements within the composition profiles were made at 2 μm increments. A total of 46 points covering a distance of 90 μm was used for each of the aluminide coated samples, while 53 points covering a distance of 104 μm was used for each of the NiCoCrAlY coated samples.

In the NiCoCrAlY coated samples bearing no Ni—Re interlayer, three prominent differences were noted between the microstructure before and after oxidation exposure. First, the β-NiAl phase within the coating had coarsened. Second, the diffusion zone had grown, increasing to approximately 30 μm, and the amount of the darker, β-NiAl phase within the diffusion zone had increased. Third, a zone in which the β-NiAl phase was depleted had formed in the NiCoCrAlY coating adjacent to the IN738LC substrate. A β-NiAl depletion zone also formed along the outer surface of the coating during the 1000 hr oxidation treatment.

The only difference observed between NiCoCrAlY-coated samples that bore a Ni—Re interlayer and those that did not was the thickness of the β-NiAl depletion zone. The Ni—Re interlayer decreased the thickness of the depletion zone.

Figure 2:
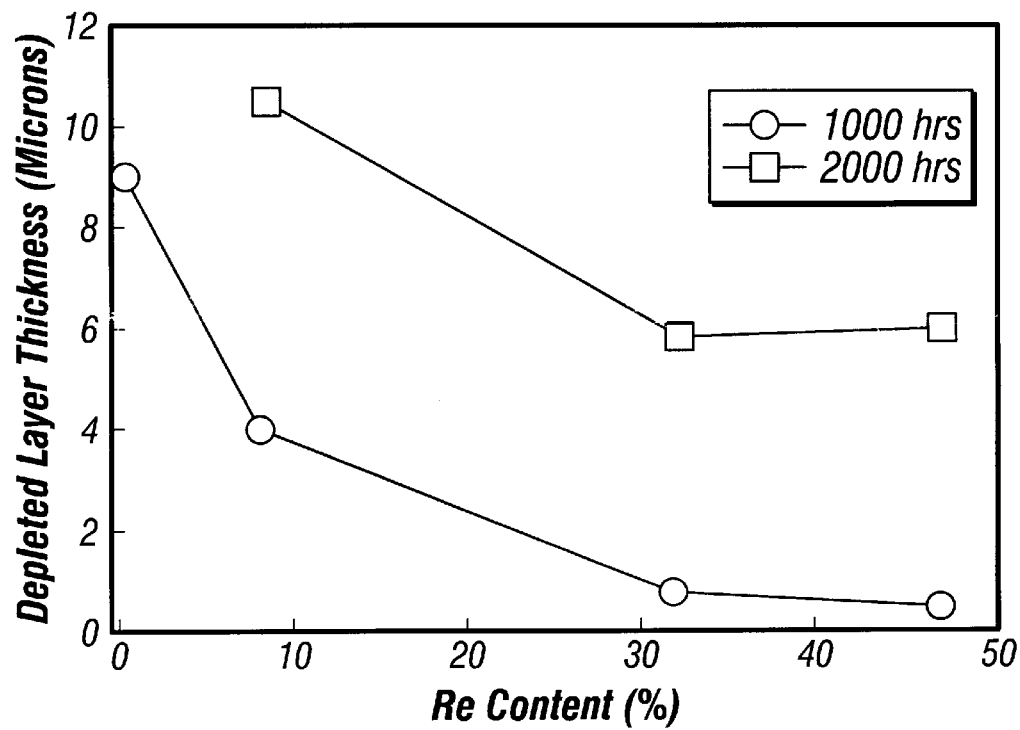
FIG. 2 is a chart showing depletion zone thickness vs. rhenium content for the oxidation coupons of Example II at 1000 hours and 2000 hours oxidation exposure.

The formation of the β-NiAl depletion zone along the coating/substrate interface is believed to be due to the diffusion of Al from the coating into the substrate. The fact that Re lessened the growth of this layer indicates that Re obstructs the inward diffusion of Al. When the depletion zone thickness was plotted versus exposure time, three separate curves are obtained, as shown in FIG. 1. The Re free sample exhibited the most rapid growth of the depletion layer, the 8 wt. % Re samples exhibited intermediate growth rates, and the 32 wt. % and 47 wt. % Re samples exhibited the slowest and virtually identical growth rates. The decrease in depletion zone thickness with increase in Re content can be clearly seen in FIG. 2, which is a plot of depletion zone thickness vs. rhenium content for the oxidation coupons at 1000 hours and 2000 hours oxidation exposure.

Both MCrAlY and aluminide type coatings protect against oxidation and hot corrosion by forming a protective $Al_2O_3$ surface layer. Degradation of the coatings occurs by depletion of the aluminum content of the coating. The foregoing results clearly show that the application of a thin interlayer of Ni—Re beneath the MCrAlY coating can significantly decrease the growth rate of the inner β-NiAl depletion zone. Order of magnitude reductions in the inner depletion zone thickness formed at 1000 hours were obtained with both the Ni-32 wt. % Re and the Ni-47 wt. % Re interlayer coatings. Since formation of the inner depletion zone is believed to result from interdiffusion with the substrate, these results suggest that the Ni—Re interlayer provided a significant impediment to the inward diffusion of aluminum into the substrate.

A person of ordinary skill in the art will recognize that many modifications may be made to the present invention without departing from the spirit and scope of the invention. The embodiment described herein is meant to be illustrative only and should not be taken as limiting the invention, which is defined in the following claims.

We claim:

1. A method of forming a diffusion barrier between a superalloy substrate and an overlay coating comprising aluminum, said method comprising, in an inert atmosphere forming a first film comprising a quantity of rhenium atoms on an outer surface of said superalloy substrate, and, subjecting said first film to first conditions comprising a source of thermal energy effective to retain a majority of said quantity of rhenium atoms on said surface while causing a minor portion of said quantity of rhenium atoms to penetrate into said surface; and subjecting said overlay coating to second conditions comprising a source of thermal energy effective to form a diffusion barrier comprising an interfacial zone coated by a second film, said interfacial zone comprising said minor portion of said quantity of rhenium atoms mixed with atoms of said superalloy substrate, a major portion of said rhenium atoms comprising said second film, wherein said diffusion barrier is effective to suppress diffusion of said aluminum from said overlay coating under static oxidation testing conditions.

2. The method of claim 1 wherein said first conditions comprise heating said superalloy substrate to a first temperature for a first amount of time.

3. The method of claim 2 wherein said first temperature is in the range of from about 1000° C. (1832° F.) to about 1150° C. (2100° F.) and said first amount of time is about one hour.

4. The method of claim 2 wherein said method further comprises forming an overlay coating at said surface over said second film; and annealing said overlay coating, wherein said second conditions comprise heating said superalloy substrate to a second temperature for a second amount of time effective to anneal said overlay coating and to form said diffusion barrier.

5. The method of claim 1 wherein said forming a first film comprising a quantity of rhenium atoms comprises sputtering a target comprising rhenium with an energetic beam of ions in a vacuum at an energy and a current density sufficient to deposit said first film.

6. A method of forming a diffusion barrier between a superalloy substrate and an overlay coating comprising aluminum, said method comprising, in an inert atmosphere:

sputtering a target comprising rhenium with an energetic beam of ions in a vacuum at an energy and a current density sufficient to deposit a first film comprising a quantity of rhenium atoms on an outer surface of said superalloy substrate;

subjecting said first film to a first temperature for a first amount of time effective to retain a majority of said quantity of rhenium atoms on said surface while causing a minor portion of said quantity of rhenium atoms to penetrate said surface;

subsequently depositing an overlay coating onto said surface; and heating said superalloy substrate to a second temperature and for a second amount of time effective to anneal said overlay coating and to form a diffusion barrier comprising an interfacial zone coated by a second film, said interfacial zone comprising a minority of said quantity of rhenium atoms mixed with atoms of said superalloy substrate, a major portion of said rhenium atoms comprising said second film, wherein said diffusion barrier is effective to suppress diffusion of said aluminum from said overlay coating under static oxidation testing conditions.

7. The method of claim 4 wherein said second temperature is in the range of from about 1010° C. (1850° F.) to about 1150° C. (2100° F.) and said second time is in the range of from about 1 hour to about 8 hours.

8. The method of claim 4 wherein said second temperature is in the range of from about 1010° C. (1850° F.) to about 1150° C. (2100° F.) and said second time is in the range of from about 1 hour to about 8 hours.

9. The method of claim 6 wherein said second temperature is in the range of from about 1010° C. (1850° F.) to about 1150° C. (2100° F.) and said second amount of time is in the range of from about 1 hour to about 8 hours.

10. The method of claim 1 wherein said overlay coating comprises the formula MCrAlY, wherein M is selected from the group consisting of nickel, cobalt, and a combination thereof, Cr is chromium, Al is aluminum, and Y is yttrium.

11. The method of claim 2 wherein said overlay coating comprises the formula MCrAlY, wherein M is selected from the group consisting of nickel, cobalt, and a combination thereof, Cr is chromium, Al is aluminum, and Y is yttrium.

12. The method of claim 4 wherein said overlay coating comprises the formula MCrAlY, wherein M is selected from the group consisting of nickel, cobalt, and a combination thereof, Cr is chromium, Al is aluminum, and Y is yttrium.

13. The method of claim 6 wherein said overlay coating comprises the formula MCrAlY, wherein M is selected from the group consisting of nickel, cobalt, and a combination thereof, Cr is chromium, Al is aluminum, and Y is yttrium.

14. The method of claim 9 wherein said overlay coating comprises the formula MCrAlY, wherein M is selected from the group consisting of nickel, cobalt, and a combination thereof, Cr is chromium, Al is aluminum, and Y is yttrium.

15. The method of claim 5 wherein said energy is between about 0.25 keV to about 10 keV; and said current density is between about 1 to about 10 mA/cm$^2$.

16. The method of claim 6 wherein said energy is between about 0.25 keV to about 10 keV; and said current density is between about 1 to about 10 nA/cm$^2$.

17. The method of claim 9 wherein said energy is between about 0.25 keV to about 10 keV; and said current density is between about 1 to about 10 mA/cm$^2$.

18. The method of claim 5 wherein said ions are selected from the group consisting of krypton ions and xenon ions.

19. The method of claim 6 wherein said ions are selected from the group consisting of krypton ions and xenon ions.

20. The method of claim 9 wherein said ions are selected from the group consisting of krypton ions and xenon ions.

21. A method of forming a diffusion barrier between a superalloy substrate and an overlay coating comprising aluminum, said method consisting essentially of, in an inert atmosphere:

sputtering a target comprising rhenium with an energetic beam of ions in an inert atmosphere in a vacuum at an energy and a current density sufficient to deposit a first film comprising a quantity of rhenium atoms on an outer surface of said superalloy substrate;

subjecting said first film to a first temperature for a first amount of time effective to retain a majority of said quantity of rhenium atoms on said surface while causing a minor portion of said quantity of rhenium atoms to penetrate into said surface;

subsequently depositing an overlay coating onto said surface; and annealing said overlay coating at a second temperature for a second amount of time effective to anneal said overlay coating and to form a diffusion barrier comprising an interfacial zone coated by a second film, said interfacial zone comprising a minority of said quantity of rhenium atoms mixed with atoms of said superalloy substrate, a major portion of said rhenium atoms comprising said second film, wherein said diffusion barrier is effective to suppress diffusion of said aluminum from said overlay coating under static oxidation testing conditions.

22. The method of claim 1 wherein said minority of rhenium atoms comprises about 10% or less of said rhenium atoms.

23. The method of claim 4 wherein said minority of rhenium atoms comprises about 10% or less of said rhenium atoms.

24. The method of claim 6 wherein said minority of rhenium atoms comprises about 10% or less of said rhenium atoms.

25. The method of claim 9 wherein said minority of rhenium atoms comprises about 10% or less of said rhenium atoms.

26. A method of forming a diffusion barrier comprising:

forming a first film comprising a first quantity of rhenium atoms on an outer surface of a superalloy substrate; and, subjecting said first film to first conditions comprising a source of thermal energy effective to retain a majority of said first quantity of rhenium atoms on said surface while causing a minor portion of said first quantity of rhenium atoms to penetrate into said surface, thereby forming a diffusion barrier comprising an interfacial zone coated by a second film comprising a second quantity of rhenium atoms less than said first quantity, said interfacial zone comprising said minor portion of said first quantity of rhenium atoms mixed with atoms of said superalloy substrate.

27. The method of claim 26 further comprising:

applying an overlay coating comprising aluminum to said surface; and subjecting said overlay coating to second conditions comprising a source of thermal energy, wherein said diffusion barrier is effective to suppress diffusion of said aluminum from said overlay coating under static oxidation testing conditions.

* * * * *

UNITED STATES PATENT AND TRADEMARK OFFICE
CERTIFICATE OF CORRECTION

PATENT NO : 6,143,141
DATED : November 7, 2000
INVENTOR(S) : Leverant, et al.

It is certified that error appears in the above-identified patent and that said Letters Patent are hereby corrected as shown below:

Claim No. 8 is restated to read as follows:

8. The method of claim 5 wherein said second temperature is in the range of from about 1010°C (1850°F) to about 1150°C (2100°F) and said second time is in the range of from about 1 hour to about 8 hours.

Signed and Sealed this

Twenty-ninth Day of May, 2001

Attest:

NICHOLAS P. GODICI

Attesting Officer

Acting Director of the United States Patent and Trademark Office